United States Patent
Iikawa et al.

(10) Patent No.: US 8,022,467 B2
(45) Date of Patent: Sep. 20, 2011

(54) NONVOLATILE SEMICONDUCTOR MEMORY DEVICE AND METHOD OF FABRICATING THE SAME

(75) Inventors: Hirofumi Iikawa, Yokkaichi (JP); Masayuki Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 31 days.

(21) Appl. No.: 12/467,424

(22) Filed: May 18, 2009

(65) Prior Publication Data
US 2010/0102377 A1    Apr. 29, 2010

(30) Foreign Application Priority Data
Oct. 27, 2008   (JP) ................................. 2008-275558

(51) Int. Cl.
*H01L 29/792* (2006.01)
(52) U.S. Cl. ........ 257/324; 257/260; 257/270; 257/365; 257/E29.275; 257/E21.455
(58) Field of Classification Search .................. 257/260, 257/270, 365, 324, E29.275, E21.455
See application file for complete search history.

(56) References Cited

U.S. PATENT DOCUMENTS

| | | | | |
|---|---|---|---|---|
| 7,005,714 B2* | 2/2006 | Ozawa et al. | ................ | 257/390 |
| 7,087,950 B2* | 8/2006 | Willer et al. | ................ | 257/314 |
| 7,651,914 B2* | 1/2010 | Akahori et al. | ............... | 438/257 |
| 7,679,127 B2* | 3/2010 | Shiozawa et al. | ............ | 257/315 |
| 7,745,871 B2* | 6/2010 | Oh et al. | ....................... | 257/314 |
| 7,763,931 B2* | 7/2010 | Hashiguchi et al. | ......... | 257/315 |
| 2006/0141711 A1* | 6/2006 | Dong | ............................ | 438/264 |
| 2006/0240619 A1* | 10/2006 | Ozawa et al. | ................ | 438/257 |
| 2007/0111433 A1* | 5/2007 | Hirasawa et al. | ............ | 438/253 |
| 2007/0196985 A1* | 8/2007 | Ozawa et al. | ................ | 438/257 |
| 2007/0241388 A1* | 10/2007 | Yamamoto et al. | .......... | 257/314 |
| 2007/0262372 A1* | 11/2007 | Yamamoto et al. | .......... | 257/324 |
| 2007/0298568 A1* | 12/2007 | Mokhlesi | ...................... | 438/257 |
| 2008/0012061 A1* | 1/2008 | Ichige et al. | ................. | 257/315 |
| 2008/0067576 A1* | 3/2008 | Yaegashi | ...................... | 257/316 |

(Continued)

FOREIGN PATENT DOCUMENTS
JP    07-176528    7/1995
(Continued)

OTHER PUBLICATIONS

Office Action issued Feb. 17, 2011 in Korean Application No. 10-2009-101720 (w/English translation).

*Primary Examiner* — Jarrett Stark
(74) *Attorney, Agent, or Firm* — Oblon, Spivak, McClelland, Maier & Neustadt, L.L.P.

(57) ABSTRACT

A nonvolatile semiconductor memory device includes a first insulating layer, charge storage layers, element isolation insulating films, and a second insulating layer formed on the charge storage layers and the element isolation insulating films and including a stacked structure of a first silicon nitride film, first silicon oxide film, intermediate insulating film and second silicon oxide film. The first silicon nitride film has a nitrogen concentration of not less than $21 \times 10^{15}$ atoms/cm$^2$. Each element isolation insulating film includes a high-temperature oxide film formed along lower side surfaces of the charge storage layers between the charge storage layers and a coating type insulating film. The first silicon nitride film is formed on an upper surface of the high-temperature oxide film in upper surfaces of the element isolation insulating films and not on the upper surface of the coating type insulating film.

4 Claims, 9 Drawing Sheets

U.S. PATENT DOCUMENTS

| | | |
|---|---|---|
| 2008/0121972 A1 | 5/2008 | Shiozawa et al. |
| 2008/0179655 A1* | 7/2008 | Ishida et al. .................. 257/316 |
| 2008/0203481 A1* | 8/2008 | Akahori et al. ............... 257/365 |
| 2009/0011586 A1* | 1/2009 | Akahori et al. ............... 438/591 |
| 2010/0213534 A1* | 8/2010 | Sekine et al. ................. 257/321 |

FOREIGN PATENT DOCUMENTS

| | | |
|---|---|---|
| JP | 2005-26590 | 1/2005 |
| JP | 2008-10480 | 1/2008 |
| JP | 2008-78317 | 4/2008 |
| KR | 10-2007-102408 | 10/2007 |

* cited by examiner

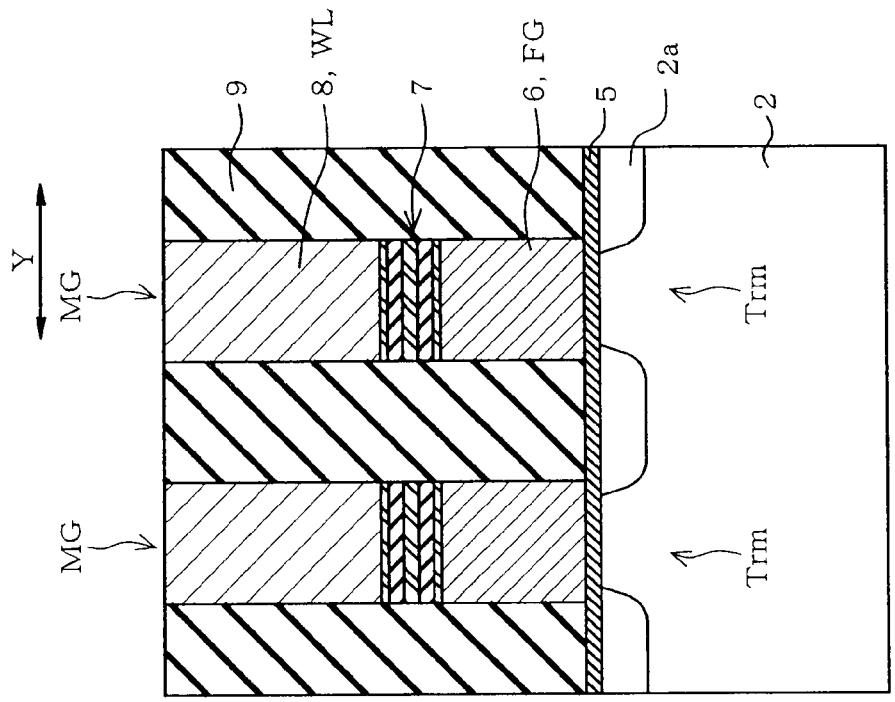
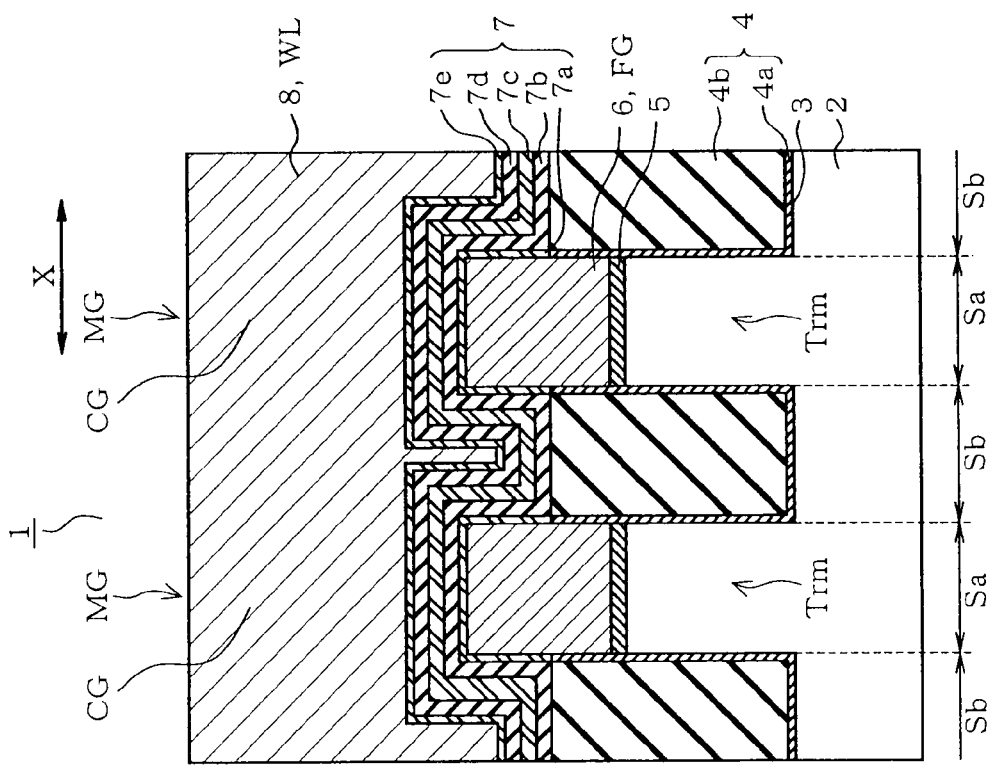
FIG. 3A
FIG. 3B

NONVOLATILE SEMICONDUCTOR MEMORY DEVICE AND METHOD OF FABRICATING THE SAME

CROSS-REFERENCE TO RELATED APPLICATIONS

This application is based on and claims the benefit of priority from the prior Japanese Patent Application No. 2008-275558, filed on Oct. 27, 2008, the entire contents of which are incorporated herein by reference.

BACKGROUND

1. Field

The present invention relates to a nonvolatile semiconductor memory device having a gate electrode structure configured with an insulating film being interposed between a charge storage layer and a control electrode, and a method of fabricating the same.

2. Related Art

Conventional nonvolatile semiconductor memory devices have a gate electrode structure of each memory cell configured with an insulating film being interposed between a charge storage layer and a control electrode in order that information may be stored in a nonvolatile manner. U.S. Patent Application Publication, US2008/0121972 discloses a technical idea that an intergate insulating film (corresponding to a second insulating film) is formed on a first gate electrode layer (corresponding to a charge storage layer). In this case, a silicon nitride film is selectively formed on an exposed surface of the first gate electrode layer, whereby the silicon nitride film is divided on an element isolation insulating film. As a result, interference between a plurality of memory cells is suppressed as much as possible.

US2008/0121972 discloses in paragraph 0034 that the silicon nitride film has a film thickness of about 1 nm in order that a silicon nitride film serving as a lowermost layer may selectively be formed only on the exposed surface of the first gate electrode layer. Furthermore, U.S. Patent Application Publication, US2008/0067576 discloses a similar fabricating method. However, the disclosed structure is insufficient to improve the threshold voltage characteristic of a memory cell.

US2008/0067576 further discloses a fabricating method in which a silicon nitride film on an element isolation insulating layer is caused to disappear by diffusing an oxidizing agent in the element isolation insulating layer particularly when an oxidizing treatment is applied to sidewalls of the gate electrodes after the forming of a silicon nitride film serving as the lowermost layer of the intergate insulating film. In the disclosed technical idea, however, the aforesaid sidewall oxidizing process is executed after a control electrode has been stacked on the intergate insulating film and an electrode structure including the control electrode has been divided. Accordingly, the sidewall oxidizing process is executed after the forming of a stacked structure of a silicon oxide film and a silicon nitride film constituting the intergate insulating film. It is difficult to effectively remove only the silicon nitride film which constitutes the intergate insulating film and is formed directly on the element isolation insulating layer. As a result, there is a possibility that prevention of interference between adjacent memory cells may become insufficient.

SUMMARY

According to one aspect of the present invention, there is provided a nonvolatile semiconductor memory device comprising a semiconductor substrate, a first insulating layer formed on the semiconductor substrate, a plurality of charge storage layers formed on the first insulating layer, a plurality of element isolation insulating films formed between the charge storage layers respectively, a second insulating layer formed on the charge storage layers and the element isolation insulating films, the second insulating layer including a stacked structure of a first silicon nitride film, a first silicon oxide film, an intermediate insulating film having a relative dielectric constant of not less than 7 and a second silicon oxide film; and a control electrode formed on the second insulating layer, wherein the first silicon nitride film has a nitrogen concentration of not less than $21 \times 10^{15}$ atoms/cm$^2$, wherein the charge storage layers have respective lower side surfaces, and each element isolation insulating film includes a high-temperature oxide film formed along the lower side surfaces of the charge storage layers between the charge storage layers and a coating type insulating film formed on an inside of the high-temperature oxide film, and wherein the high-temperature oxide film and the coating type insulating film have respective upper surfaces, and the first silicon nitride film is formed on the upper surface of the high-temperature oxide film in upper surfaces of the element isolation insulating films and not on the upper surface of the coating type insulating film.

According to another aspect of the present invention, there is provided a method of fabricating a nonvolatile semiconductor memory device, comprising forming a first insulating film on a semiconductor substrate, forming a charge storage layer on the first insulating film, forming an element isolation trench in the charge storage layer, the first insulating film and the semiconductor substrate, thereby dividing the charge storage layer into a plurality of parts, forming an element isolation insulating film in the element isolation trench so that at least a part of the charge storage layer is exposed, forming a second insulating layer on the exposed surface of the charge storage layer and the element isolation insulating film by stacking a first silicon nitride film, a first silicon oxide film, an intermediate insulating film having a relative dielectric constant of not less than 7 and a second silicon oxide film sequentially, and forming a control electrode on the second insulating layer, wherein an oxidation treatment is executed after the first silicon nitride film has been formed, or immediately after the first silicon oxide film has been formed and before the intermediate insulating film is formed.

BRIEF DESCRIPTION OF THE DRAWINGS

FIG. 3A is a schematic longitudinal section showing active areas Sa and element isolation regions Sb (No. 1);

FIG. 3B is a schematic longitudinal section showing gate electrodes MG of memory cell transistors (No. 2);

DETAILED DESCRIPTION

Figure 1:
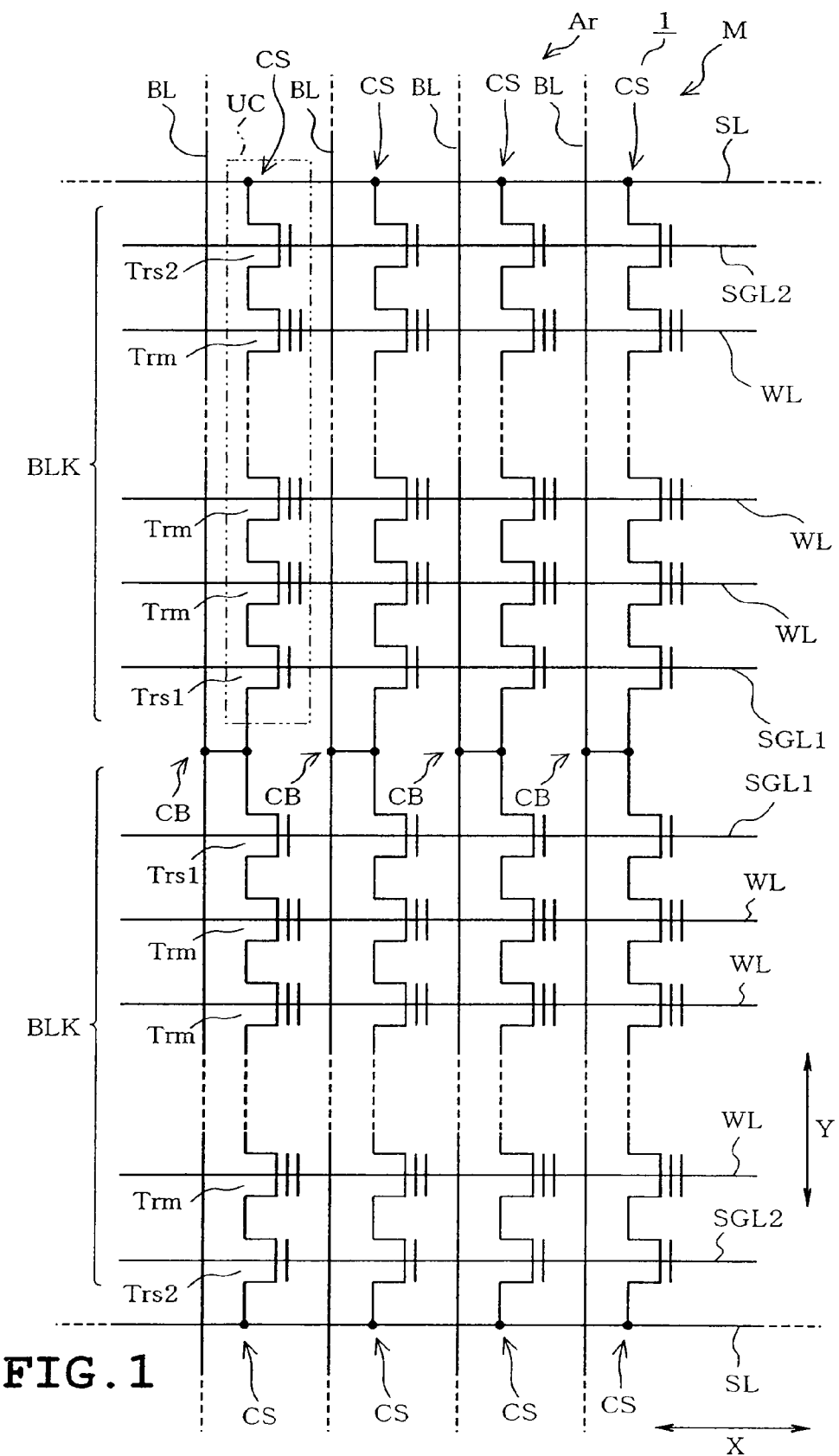
FIG. 1 is an equivalent circuit schematic showing a part of memory cell array of a NAND flash memory of one embodiment in accordance with the present invention.

One embodiment of the present invention will be described with reference to the accompanying drawings. In the embodiment applied to a NAND flash memory described below, identical or similar parts are labeled by the same reference numerals in the following description. The drawings typically illustrate the invention, and the relationship between a thickness and planar dimension, layer thickness ratio and the like differ from respective natural dimensions.

Figure 2:
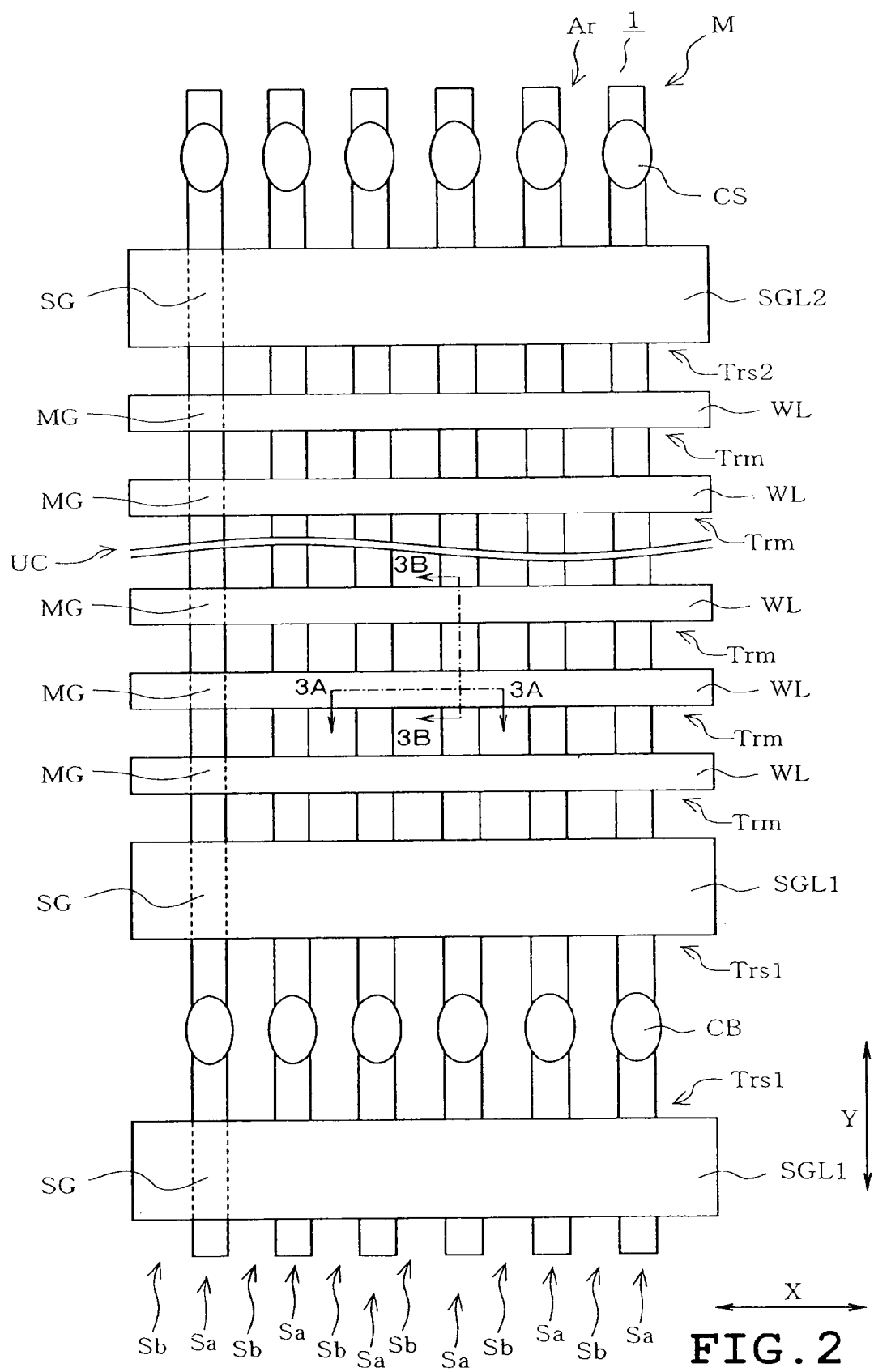
FIG. 2 is a schematic plan view showing the structure of a part of memory cell region.

Referring to FIGS. 1 and 2, the NAND flash memory 1 as a nonvolatile semiconductor memory device includes a memory cell array Ar and peripheral circuits (not shown) arranged on the periphery of the memory cell array Ar. FIG. 1 shows an electrical arrangement of a part of the memory cell array Ar, and FIG. 2 schematically shows a planar configuration of a NAND cell unit. The memory cell array Ar comprises a plurality of blocks BLK each of which comprises a plurality of NAND cell units UC. Each NAND cell unit UC comprises two selective gate transistors Trs1 and Trs2 and a plurality of (32, for example) memory cell transistors Trm (corresponding to memory cells). The memory cell transistors Trm are series-connected between the selective gate transistors Trs1 and Trs2 while the adjacent memory cell transistors share a source/drain region.

In each block BLK, the selective gate transistor Trs1 has a drain region connected via a bit line contact CB to a bit line BL. The selective gate transistor Trs2 has a source region connected via a source line contact CS to a source line SL. A bit line BL extends in the Y direction. A plurality of element isolation regions Sb each having a shallow trench isolation (STI) structure extend in the Y direction as shown in FIG. 2. Each NAND cell unit UC is formed on a plurality of active areas Sa divided by a plurality of element isolation regions Sb. The active areas Sa extend in the Y direction.

The memory cell transistors Trm have gate electrodes MG which are located above portions of the active areas Sa intersecting a plurality of word lines WL, respectively. The word lines WL are formed at predetermined intervals in the Y direction so as to extend in the X direction. The X and Y directions are normal to each other. The selective gate transistors Trs1 have gate electrodes SG which are located above portions of the active areas Sa intersecting a plurality of selective gate lines SGL1 extending in the X direction, respectively. The selective gate transistors Trs2 have gate electrodes SG which are located above portions of the active areas Sa intersecting a plurality of selective gate lines SGL2 extending in the X direction, respectively.

The memory cell transistors Trm constituting each row have respective gate electrodes MG which are common-connected to one word line WL in the X direction. The selective gate transistors Trs1 constituting each row also have respective gate electrodes SG which are common-connected to one selective gate line SGL1 in the X direction. Furthermore, the selective gate transistors Trs2 constituting each row have respective gate electrodes SG which are common-connected to one selective gate line SGL2 in the X direction.

The gate electrode structure in the memory cell region will now be described with reference to FIGS. 3A and 3B. FIG. 3A is a schematic section taken along line 3A-3A in FIG. 2 (the direction of word line or X direction), and FIG. 3B is a schematic section taken along line 3B-3B in FIG. 2 (the direction of bit line or Y direction). A well is formed in an upper portion of a semiconductor substrate 2 such as a silicon substrate although not shown. A plurality of element isolation trenches 3 are formed in the well so as to be spaced from each other in the X direction as shown in FIG. 3A. The element isolation trenches 3 isolate a plurality of active areas Sa in the X direction. A plurality of element isolation insulating films 4 are formed in the respective element isolation trenches 3, whereby the element isolation regions Sb are formed. Each element isolation insulating film 4 includes a lower portion buried in the element isolation trench 3 and an upper portion protruding upward from a surface of the semiconductor substrate 2.

Each element isolation insulating film 4 includes a high temperature oxide (HTO) film 4a formed along an inner surface of the element isolation trench 3 and a coating type insulating film 4b buried inside the HTO film 4a. Gate insulating films 5 are formed on the active areas Sa divided by the element isolation regions Sb in the X direction respectively. Each gate insulating film 5 is made from a silicon oxide film, for example, and serves as a first insulating layer. Each gate insulating film 5 is formed so that both ends thereof are in contact with portions of side surfaces of adjacent element isolation insulating films 4 respectively. A plurality of floating gate electrodes FG serving as charge storage layers are formed on upper surfaces of the gate insulating films 5 respectively. Each floating gate electrode FG comprises a polycrystalline silicon layer 6 (conductive layer or semiconductor layer) doped with impurities such as phosphorus (P). The polycrystalline silicon layer 6 includes a lower side serving as a contact surface which is in contact with an upper side surface of the element isolation insulating film 4. The polycrystalline silicon layer 6 also includes an upper side surface protruding above the upper surface of the element isolation insulating film 4. The upper side surface of each element isolation insulating film 4 is in contact with the side surface of the gate insulating film 5 and the lower side surface of the polycrystalline silicon layer 6.

An intergate insulating film 7 is formed along the upper surfaces of the element isolation insulating films 4, upper side surfaces and upper surfaces of the floating gate electrodes FG. The intergate insulating film 7 serves as an interpoly insulating film, an inter-conductive layer insulating film, an inter-electrode insulating film and a second insulating layer. The intergate insulating film 7 has a stacked structure including a silicon nitride film 7a, a silicon oxide film 7b, a silicon nitride ($Si_3N_4$) film 7c serving as an intermediate insulating film, a silicon oxide film 7d and a silicon nitride film 7e sequentially from the lower layer side (from the side surface and upper surface of the floating gate electrode FG). The film structure of the intergate insulating film 7 will be described in detail later.

A conductive layer 8 is formed on the intergate insulating film 7 so as to extend in the X direction (the direction of word lines WL). The conductive layer 8 functions as the word lines WL which connect the control electrodes CG of the memory cell transistors Trm to one another. The conductive layer 8 comprises a polycrystalline silicon layer and a silicide layer formed by silicifying any one of tungsten (W), cobalt (Co) and nickel (Ni) formed on the polycrystalline silicon layer, for example. Thus, the gate electrode MG of each memory cell transistor Trm has a gate structure formed by stacking the floating gate electrode FG, the intergate insulating film 7 and the control gate CG.

The gate electrodes MG of the memory cell transistors Trm are lined in the Y direction as shown in FIG. 3B. The gate electrodes MG are electrically separated from each other. Interlayer insulating films 9 are formed in respective separating regions. Each interlayer insulating film 9 comprises a silicon oxide film, for example. Diffusion layers (source/drain regions) 2a are formed near opposite ends of the underside of each gate electrode MG so as to be located at a surface layer of the silicon substrate 2. Each memory cell transistor Trm includes the gate insulating film 5, the gate electrode MG and the source/drain region 2a.

In the flash memory 1, a Fowler-Nordheim (F-N) tunneling current flows via the gate insulating film 5 to the floating gate electrode FG side when the peripheral circuit (not shown) applies a high positive voltage (20 V, for example) between each word line WL and the well during data writing, for example. Accordingly, electrons are injected into each floating gate electrode FG such that a threshold voltage of the memory cell transistor Trm is shifted forward. In this case, the electrons move from the floating gate electrode FG through the intergate insulating film 7 to the word line WL side. An amount of electron accumulation is saturated in the floating gate electrode FG, resulting in leak current. The threshold voltage during data writing onto the memory cell transistor Trm is saturated.

Figure 4:
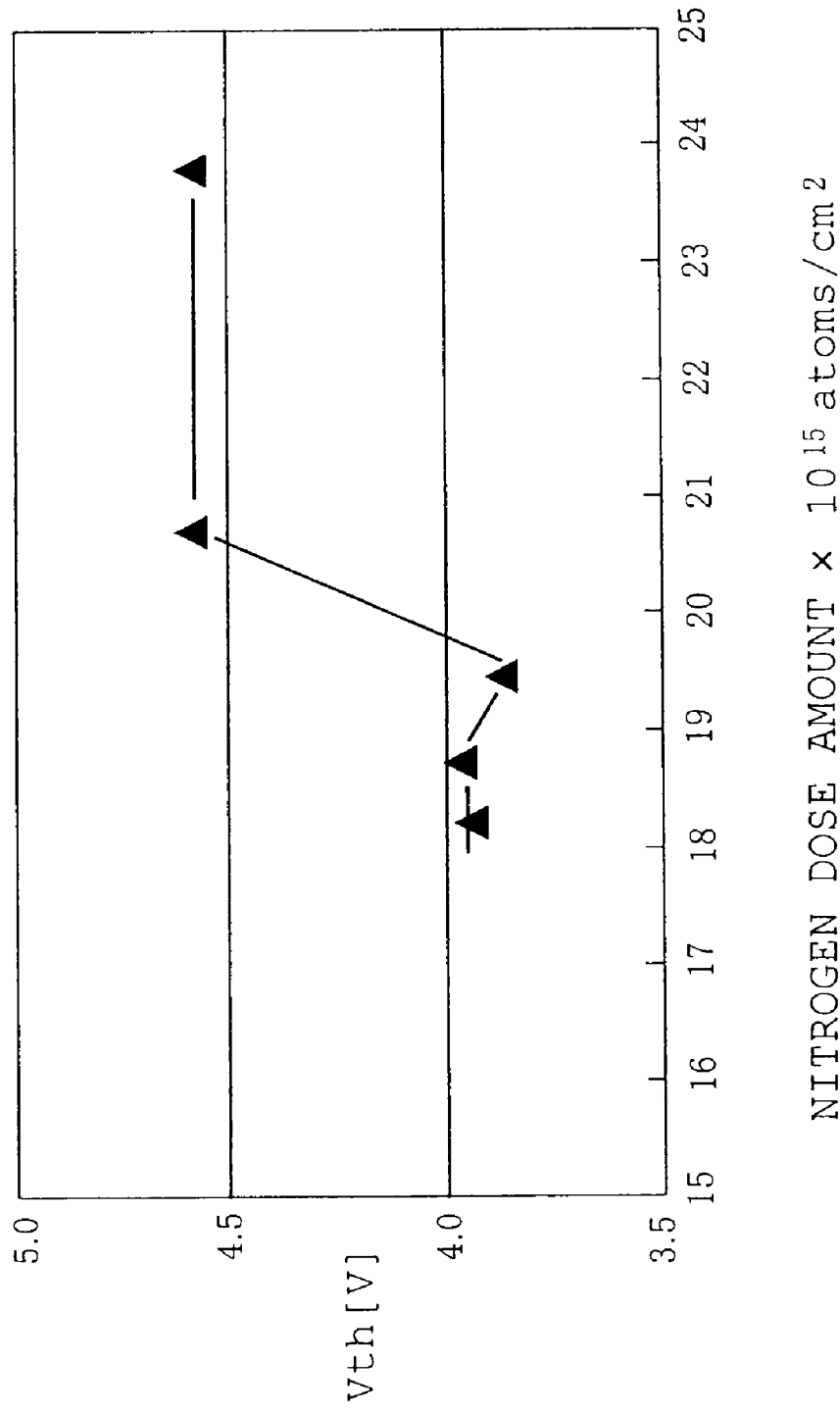
FIG. 4 is a curve showing the nitrogen dose dependency of a threshold voltage.

The film-forming structure of the intergate insulating film 7 will now be described in detail. The inventors have found that increasing a nitrogen concentration (hereinafter, "nitrogen dose") in the silicon nitride film 7a is highly effective for improvement in the data writing characteristic. FIG. 4 shows the relationship between the nitrogen dose and the writing threshold voltage. In FIG. 4, the axis of abscissas denotes values obtained by measuring, by the X-ray photoelectron spectroscopy (XPS), a nitrogen dose in the silicon nitride film formed on a silicon monocrystalline substrate upon execution of a nitriding treatment. The axis of ordinates denotes values of saturation threshold voltage.

As shown in FIG. 4, it is understood that when the nitrogen dose in the silicon nitride film exceeds $20 \times 10^{15}$ atoms/cm$^2$ and becomes equal to or larger than $21 \times 10^{15}$ atoms/cm$^2$, the saturation threshold value is improved by about 0.5 V as compared with the case where the nitrogen dose in the silicon nitride film is less than $20 \times 10^{15}$ atoms/cm$^2$. More specifically, the nitrogen dose should be set at a value equal to or larger than $21 \times 10^{15}$ atoms/cm$^2$ in order that the saturated threshold voltage may be improved. An upper limit of the saturated threshold voltage should not be limited. It is generally difficult to obtain by a nitriding treatment a nitrogen concentration exceeding a silicon nitride film ($Si_3N_4$) of stoichiometric composition. Accordingly, the upper limit should be a value of not more than the nitrogen dose corresponding to $Si_3N_4$, for example.

Furthermore, the inventors have considered the matter from a different perspective. It has been found that a NAND flash memory is inferior in charge retention characteristics if the silicon nitride films 7a are structurally connected together between the floating gate electrodes FG of the memory cell transistors Trm adjacent to each other. In particular, as shown in FIG. 3A, when the silicon nitride film 7a is formed along the upper surface and upper side surface of the floating gate electrode FG, an upper surface of the element isolation insulating film 4 is also subjected to the nitriding treatment. A nitrogen-containing layer is formed on the element isolation insulating film 4, too when the nitriding treatment is enhanced so that the saturated threshold voltage characteristic is improved by increasing the nitrogen dose in the silicon nitride film 7a as described above. As a result, there is an increasing concern that charge (electrons) moves between the adjacent floating gate electrodes FG.

In view of the above-described concern, the silicon nitride film 7a is divided on the upper surface of the element isolation insulating film 4 in the embodiment. In particular, the silicon nitride film 7a is formed only on the side end of the element isolation insulating film 4 (particularly, on the upper surface of the HTO film 4a), and no silicon nitride film 7a is formed on an upper surface portion of the film 4 located near the central portion of the film 4 (particularly, the upper surface of the coating type insulating film 4b). More specifically, the intergate insulating film 7 has, on the aforesaid upper surface portion of the film 4, the stacked structure including the silicon oxide film 7b, the silicon nitride film 7c, the silicon oxide film 7d and a silicon nitride film 7e sequentially stacked from the lower layer side (the element isolation insulating film 4 side) to the upper layer side. This reduces the possibility of movement of electrical charge between adjacent floating gate electrodes FG, resulting in an improvement of the charge retention characteristic.

Figure 5:
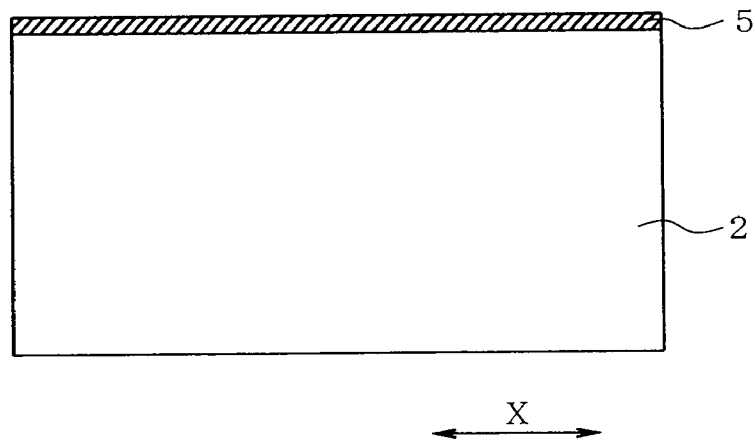
FIGS. 5 to 14 are schematic longitudinal sections of the semiconductor memory device, showing fabrication stages.
Figure 6:
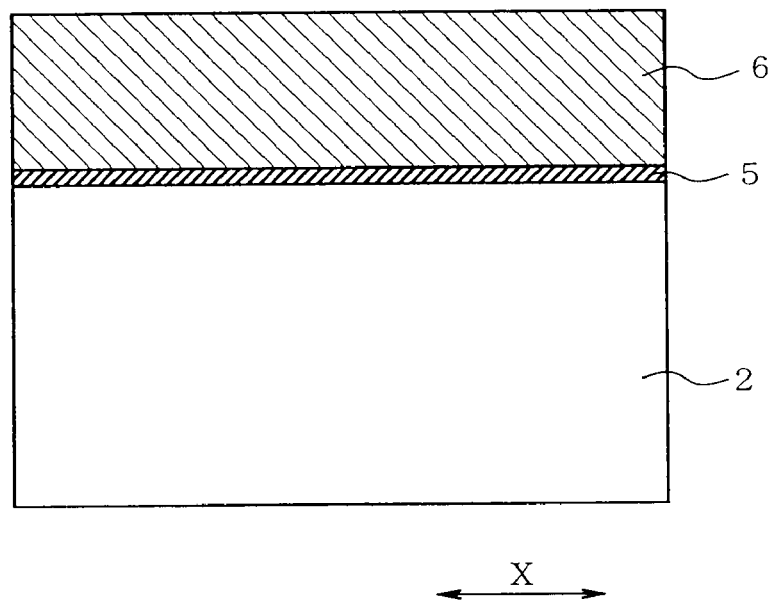

A fabricating method of the foregoing structure will now be described. FIGS. 5 to 14 schematically illustrate the NAND flash memory in fabrication stages. Impurities are implanted into a surface layer of the semiconductor substrate 2 for the forming of the well and channels although the impurity implantation is not shown. Subsequently, the gate insulating film 5 is formed on the upper surface of the semiconductor substrate 2 by the thermal oxidation method so as to have a predetermined film thickness (about 1 nm to 15 nm, for example), as shown in FIG. 5. Subsequently, the polycrystalline silicon layer 6 serving as a charge storage layer is formed on the gate insulating film 5 by a chemical vapor deposition (CVD) process so as to have a predetermined film thickness (about 50 nm to 200 nm, for example) as shown in FIG. 6.

Figure 7:
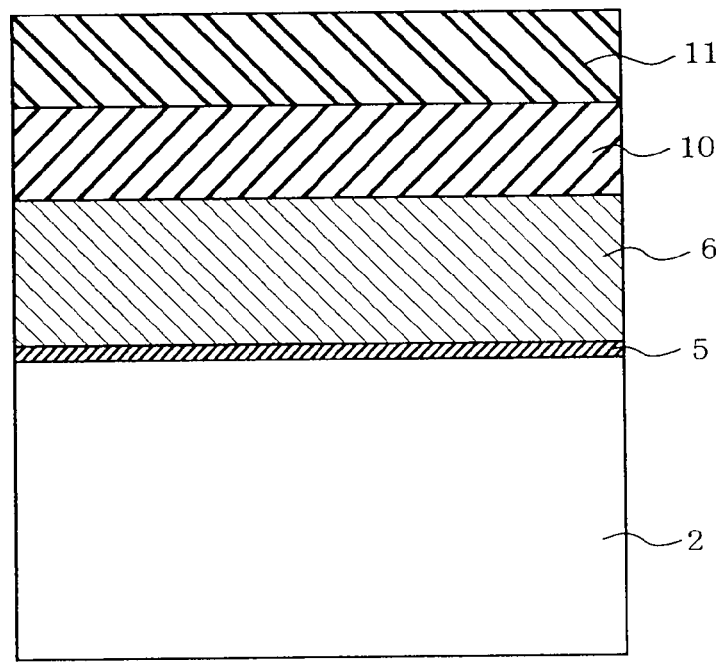

Subsequently, the silicon nitride film 10 is formed by the CVD process so as to have a predetermined film thickness (about 50 nm to 200 nm, for example) as shown in FIG. 7. The silicon oxide film 11 is then formed by the CVD process so as to have a predetermined film thickness (about 50 nm to 400 nm, for example). Subsequently, a photoresist (not shown) is patterned on the silicon oxide film 11, and an anisotropic etching treatment by means of a reactive ion etching (RIE) process is applied to the silicon oxide film 11 with the resist serving as a mask. A region of the silicon oxide film 11 to be removed in this case corresponds to an upper part of the forming region of the element isolation trench 3. The patterned resist is then removed by ashing.

Figure 8:
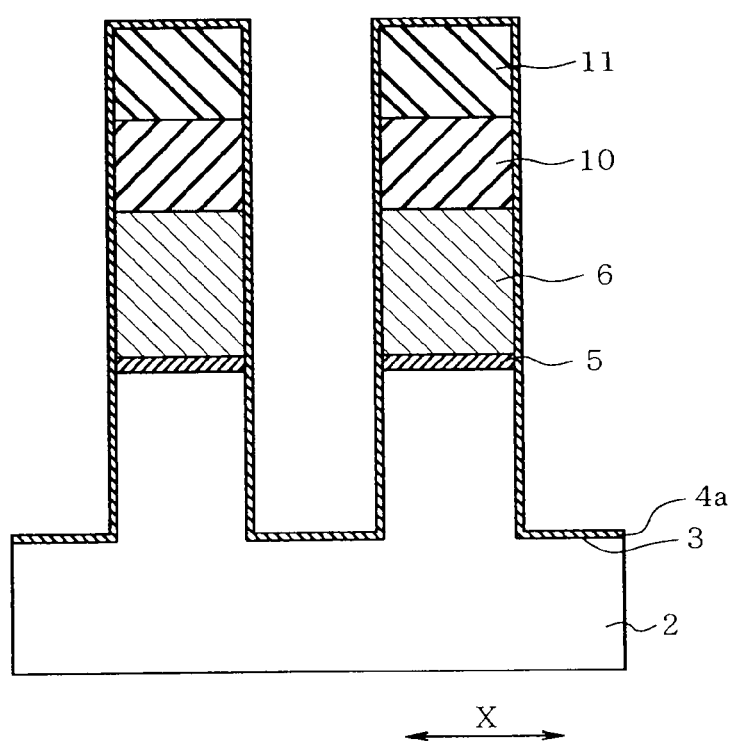

Subsequently, an anisotropic etching treatment by means of the RIE process is applied to the silicon nitride film 10 with the silicon oxide film 11 serving as a mask as shown in FIG. 8. Next, the anisotropic etching treatment by means of the RIE process is further applied to the polycrystalline silicon layer 6, the gate insulating film 5 and an upper part of the semiconductor substrate 2, so that the element isolation trenches 3 are formed. The HTO film 4a having a relatively higher etching resistance is formed along inner surfaces of the element isolation trenches 3 by a low pressure chemical vapor deposition (LPCVD) process.

Figure 9:
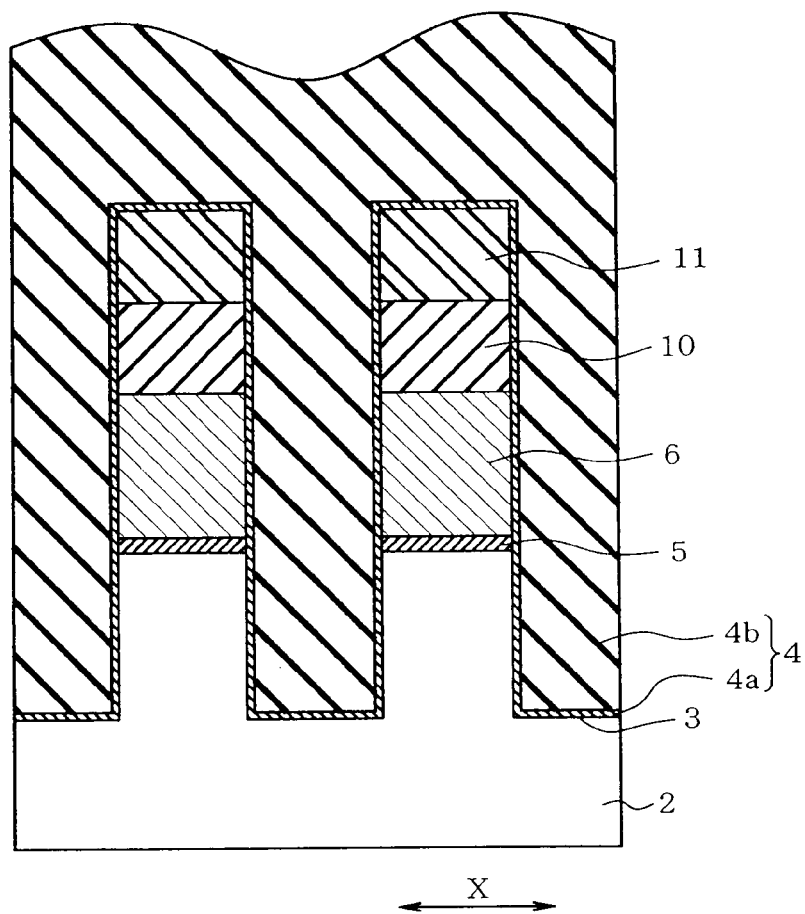

Subsequently, the coating type insulating film 4b derived from polysilazane, for example, is formed along the inside of the HTO film 4a using a coating technique so as to fill the element isolation trenches 3 as shown in FIG. 9. The coating type insulating film 4b is an insulating film that can be etched more easily than the HTO film 4a. After application of a polysilazane coating liquid, a density growth process is applied to the coating type insulating film 4b in the presence of oxygen or moisture vapor. As a result, the element isolation insulating film 4 is composed of the HTO film 4a and the coating type insulating film 4b.

Figure 10:
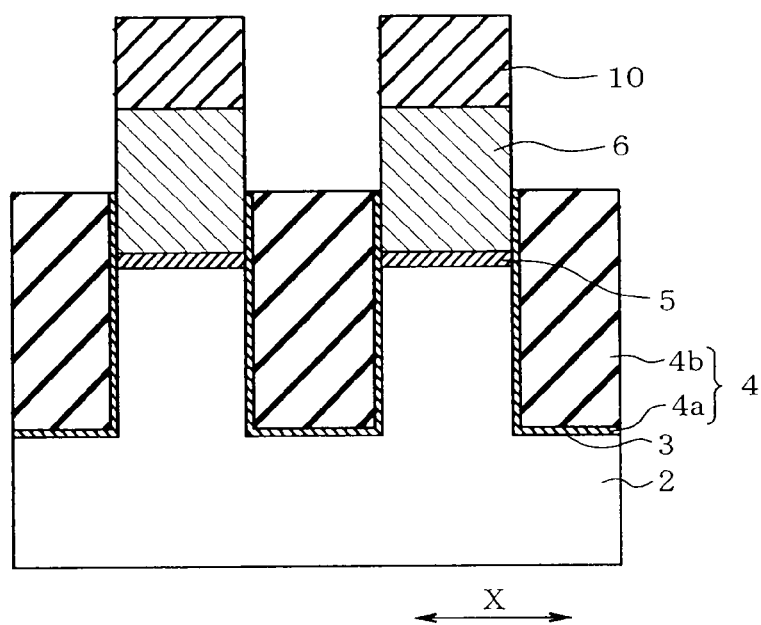

Subsequently, a planarization process is executed by a chemical mechanical polishing (CMP) process with the silicon nitride film 10 serving as a stopper as shown in FIG. 10. Next, the element isolation insulating film 4 is etched back using a known etching condition having a higher selectivity for a silicon nitride film. As a result, for example, the upper surface or at least a part of the upper side surface of the polycrystalline silicon film 6 (the upper side surface, in the embodiment) is exposed. The silicon nitride film 10 is then removed by an etching process using chemicals or the like, whereby an upper surface of the polycrystalline silicon layer 6 is exposed.

Figure 11:
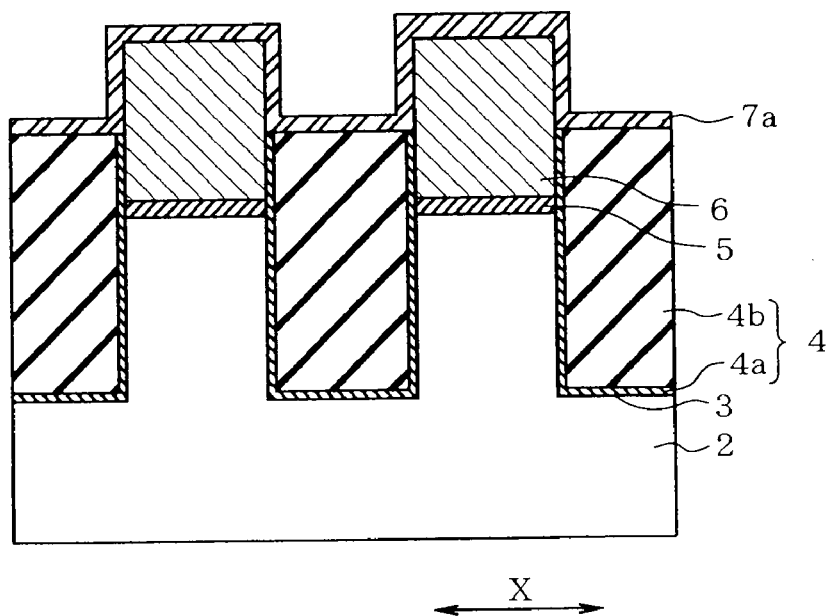
Figure 12:
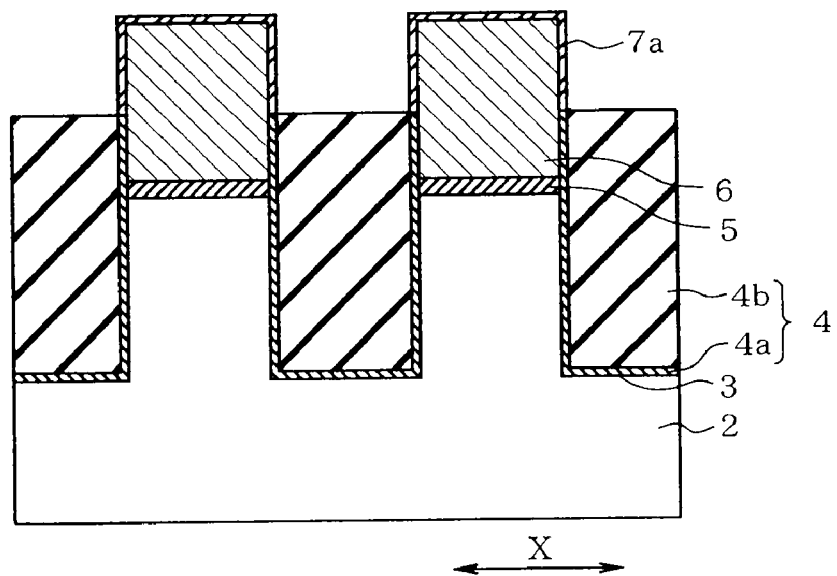

Subsequently, a nitriding treatment by a radical nitridation process is executed so that the silicon nitride film 7a is formed on the upper surfaces and upper side surfaces of the polycrystalline silicon layers 6 and the upper surfaces of the element isolation insulating films 4 as shown in FIG. 11. The aforesaid radical nitridation process is characterized by the use of nitrogen physically excited by plasma or the like. Microwaves are produced in the presence of a nitrogen gas, whereby radical nitrogen is generated to be used for the nitridation process. Exposed surfaces of the polycrystalline silicon layers 6 can easily be nitrided in the above-described nitridation process. An amount of nitridation depends upon treatment conditions and can optionally be adjusted. A treatment temperature and a treating time can be reduced as the result of application of the radical nitridation process.

The following are nitriding conditions for forming the silicon nitride film 7a with the aforesaid desirable nitrogen dose equal to or larger than $21 \times 10^{15}$ atoms/cm$^2$. Firstly, it is desirable to set the microwave intensity at a value ranging from 500 W to 3000 W. Secondly, it is desirable to set the process pressure at a value ranging from 5 Pa to 30 Pa. Thirdly, it is desirable to set the temperature of the semiconductor substrate 2 at a value ranging from 350° C. to 900° C. It is more preferable to set the microwave intensity at a value ranging from 1000 W to 3000 W.

On the other hand, when the silicon nitride film 7a is formed with the nitride dose thereof being increased, a large amount of electrical charge moves through the intergate insulating film 7 between the floating gate electrodes FG adjacent to each other, whereupon there is a possibility that the threshold voltage characteristics of each memory cell transistor Trm may deteriorate. In view of the above-described problem, the embodiment includes a subsequent process in which portions of the silicon nitride film 7a are caused to disappear from the upper surfaces of the element isolation insulating films 4 (particularly, from the coating type insulating films 4b).

More specifically, for example, a radical or plasma oxidation treatment is carried out so that oxygen atoms are selectively substituted for nitrogen atoms in the silicon nitride film 7a formed on the upper surface of the insulating film 4. Since portions of the silicon nitride film 7a are removed and caused to disappear from the element isolation insulating film 4 (particularly, from the coating type insulating film 4b), there is no possibility that portions of the silicon nitride film 7a are connected together between the adjacent floating gate electrodes FG. Consequently, the threshold voltage characteristic of the memory cell transistor Trm can be maintained at a desired value.

The radical oxidation treatment is a process in which hydrogen and oxygen gases are caused to react with each other with the result of production of an oxidizing agent, which is used for oxidation. The following are conditions of the radical oxidation treatment in the embodiment. Firstly, a flow ratio of a hydrogen-oxygen mixed gas is represented as a hydrogen gas ratio ranging from 0.5% to 10%. Secondly, a treatment temperature ranges from 700° C. to 1000° C., and thirdly, an oxide film with a film thickness of less than 3 nm is formed on the surface of the semiconductor substrate 2 as an amount of oxidation.

The following is the reason for provision of the above-described treatment conditions. That is, when the conditions are applied under which an oxide film with a film thickness of not less than 3 nm is formed, the silicon nitride film 7a formed on the upper surfaces and upper side surfaces of the floating gate electrodes FG are caused to disappear excessively and/or the nitrogen dose is reduced below $21 \times 10^{15}$ atoms/cm$^2$ such that the film quality of the nitride film deteriorates. Furthermore, when a radical oxidation treatment is applied, a treating time can be reduced, and a long-distance transport of oxidizing species in the silicon nitride film 7a can be realized.

In the case of plasma oxidation, oxidation can be carried out by the use of an oxidizing agent produced by physical excitation of oxygen as the result of application of a high-frequency electric field to the atmosphere containing an oxygen gas. When the above-described radical or plasma oxidation treatment is carried out immediately after the forming of the silicon nitride film 7a, the portions of the silicon nitride film 7a located between the adjacent floating gate electrodes FG can be caused to disappear while each floating gate electrode retains the nitridation film quality which effectively increases the saturation threshold voltage. The oxidation process may be executed in a plurality of divided processes, and there is no particular limitation in the number of times of treatment. An amount of oxidation can be adjusted within a range that does not cause the silicon nitride film 7a to disappear on the floating gate electrodes FG.

The reason for selective disappearance of the silicon nitride film 7a will be inferred as follows. The silicon oxide film composing the element isolation insulating film 4 has a lower silicon density than the polycrystalline silicon that is a material for the floating gate electrodes FG. Since the silicon nitride film 7a on the element isolation insulating film 4 is formed by an ordinary nitridation treatment such as the radical nitridation process, the silicon nitride film 7a has a more fragile film quality than the silicon nitride film 7a on the floating gage electrodes FG. As a result, the nitride film layer formed on the element isolation insulating film 4 is considered to be easily diffused inward or outward by the oxidizing agent.

Figure 13:
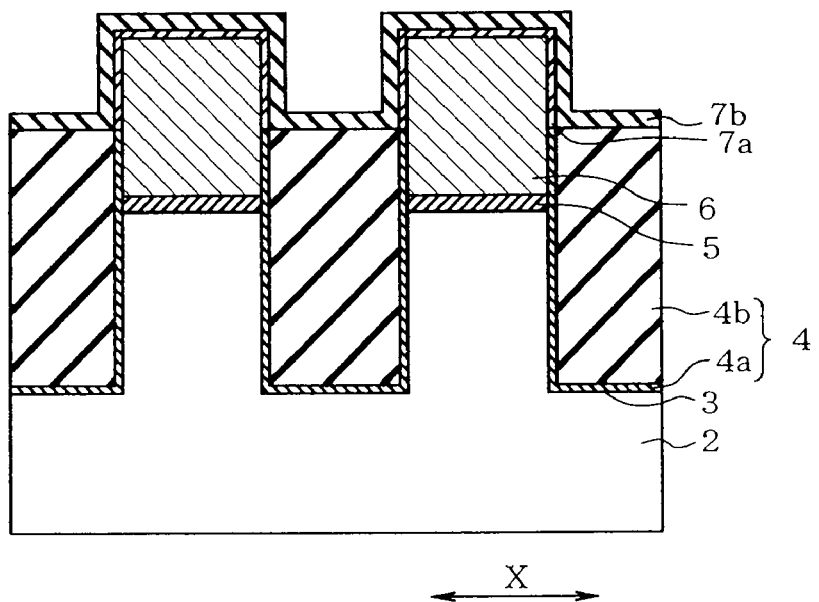

Subsequently, the silicon oxide film 7b is formed on the upper surfaces and upper side surfaces of the silicon nitride films 7a and the upper surfaces of the element isolation insulating films 4 (particularly, on the coating type insulating film 4b) by the CVD process as shown in FIG. 13. In this case, the silicon oxide film 7b can be formed under a film forming condition that dichlorosilane (SiH$_2$Cl$_2$) and nitrogen monoxide (N$_2$O) are reacted with each other at about 800° C.

Figure 14:
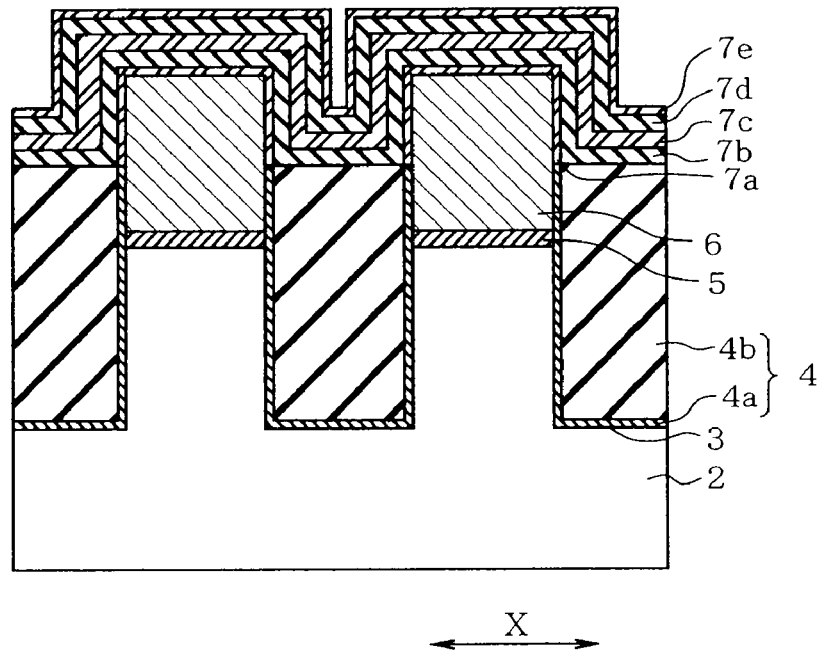

Subsequently, the silicon nitride film 7c is formed on the silicon oxide film 7b by the CVD process as shown in FIG. 14. In this case, the silicon nitride film 7c is formed under the film forming condition that dichlorosilane (SiH$_2$Cl$_2$) and ammonia (NH$_3$) are reacted with each other at about 800° C. The above-described film forming is repeated so that a repetitive structure (stacked structure of a nitridation film layer and an oxide film layer) can be formed which includes the silicon nitride film 7a, silicon oxide film 7b, silicon nitride film 7c, the silicon oxide film 7d and silicon nitride film 7e. As a result, a film structure as shown in FIG. 14 is obtained. The film thicknesses and the number of films of the intergate insulating film 7 depend upon an electric field during operation of the element. The intergate insulating film 7 should not be limited to the above-described stacked structure.

Subsequently, the conductive layer 8 is formed on the intergate insulating film 7 by the CVD method or the like as shown in FIG. 3A. The conductive layer 8 serves as the control electrodes CG and word lines WL. A mask pattern is then patterned on the stacked structure of the layers 6 to 8 by the photolithography technique, and an anisotropic etching process such as the RIE process is executed so that the stacked structure is divided into a plurality of regions in the Y direction. An implantation treatment is carried out for the purpose of forming the source/drain regions 2a so that the source/drain regions 2a are activated thereby to be formed into diffusion layers 2a. Interlayer insulating films 9 are formed from, for example, a silicon oxide film in the respective divided regions, whereupon the memory cell structure as shown in FIG. 3B is obtained. Thereafter, the fabrication sequence includes normal processes of forming an interlayer insulating film, forming contacts and forming bit lines BL, post processes and the like, so that the fabrication of flash memory device 1 is completed.

According to the foregoing embodiment, the silicon nitride film 7a is formed so as to have a nitrogen concentration of not less than $21 \times 10^{15}$ atoms/cm$^2$. As a result, the threshold voltage characteristic of the memory cell can be improved. Furthermore, since the radical oxidation treatment is carried out immediately after the forming of the silicon nitride film 7a, only the silicon nitride film 7a on the element isolation insulating film 4 (particularly the coating type insulating film 4b) can effectively be caused to disappear. In this case, since the silicon nitride film 7a disappears while being divided between the adjacent floating gate electrodes FG, the movement of electric charges between the floating gate electrodes FG can be suppressed as much as possible, whereby the interference between the adjacent floating gate electrodes FG can be suppressed as much as possible. In such a case, no silicon nitride film 7a is formed directly on the element isolation insulating film 4 and the silicon oxide film 7b is formed directly on the element isolation insulating film 4.

The foregoing embodiment should not be regarded as limitations but may be modified or expanded as follows. Although the NAND flash memory device 1 has been described in the foregoing embodiment, the embodiment may be applied to a nonvolatile semiconductor memory device with a memory cell having a charge storage layer, such as NOR flash memories. Furthermore, the semiconductor substrate 2 may be a p-type silicon substrate or a semiconductor substrate formed with p-type wells in a surface layer of an n-type silicon substrate.

The element isolation insulating film 4 may be formed by combining silicon oxide films formed by the high-density plasma-chemical vapor deposition (HDP-CVD) method. Furthermore, although the silicon nitride film 7a is formed by the radical nitridation process in the foregoing embodiment, any process may be applied only if the process can form a nitride film on an exposed surface of the charge storage layer. For example, a normal thermal nitridation process using an electric furnace may be applied, instead.

The radical oxidation treatment and plasma oxidation treatment are employed for the treatment of causing the silicon nitride film 7a to disappear in the foregoing embodiment. However, a wet oxidation, dry oxidation, ozone oxidation or the like may be applied. Furthermore, the oxidation of the silicon nitride film 7a is carried out immediately after the forming of the film 7a in the foregoing embodiment. However, the oxidation of the silicon nitride film 7a may be carried out immediately after the forming of the silicon oxide film 7b, that is, before the forming of the silicon nitride film 7c.

The silicon nitride film 7c with the relative dielectric constant of not less than 7 is applied to the intermediate insulating film in the foregoing embodiment. However, a film with the relative dielectric constant of 7 or above may be applied to the intermediate insulating film, instead. For example, such a film may be a single layer film or stacked film including any one of an aluminum oxide ($Al_2O_3$) film with the relative dielectric constant of about 8, a magnesium oxide (MgO) film with the relative dielectric constant of about 10, a yttrium oxide ($Y_2O_3$) film with the relative dielectric constant of about 16, hafnium oxide ($HfO_2$) film, zirconium oxide ($ZrO_2$) film each of which has the relative dielectric constant of about 22, and lanthanum ($La_2O_3$). Furthermore, the film with the relative dielectric constant of 7 or above may be an insulating film comprising a ternary compound such as a hafnium silicate (HfSiO) film or a hafnium-aluminate (HfAlO) film. More specifically, an oxide or nitride containing at least one of silicon (Si), aluminum (Al), magnesium (Mg), yttrium (Y), hafnium (Hf), zirconium (Zr) and lanthanum (La).

Furthermore, the intergate insulating film 7 has the stacked structure of the silicon nitride film 7a, the silicon oxide film 7b, the silicon nitride film 7c, the silicon oxide film 7d and the silicon nitride film 7e, that is, the NONON structure in the foregoing embodiment. However, the intergate insulating film 7 may have a NONO structure without an uppermost layer of silicon nitride film 7e, instead.

Substitution of oxygen atoms for nitrogen atoms is enhanced on the element isolation insulating film 4 when the silicon nitride film 7a has a nitrogen concentration of not less than $21 \times 10^{15}$ atoms/cm$^2$ on the upper surface and upper side surface of each floating gate electrode FG. When the nitrogen concentration of the silicon nitride film 7a is sufficiently low on the element isolation insulating film 4, the silicon nitride film 7a may be connected between the floating gate electrodes FG.

The foregoing description and drawings are merely illustrative of the principles and are not to be construed in a limiting sense. Various changes and modifications will become apparent to those of ordinary skill in the art. All such changes and modifications are seen to fall within the scope as defined by the appended claims.

What is claimed is:

1. A nonvolatile semiconductor memory device comprising:
    a semiconductor substrate;
    a first insulating layer formed on the semiconductor substrate;
    a plurality of charge storage layers formed on the first insulating layer;
    a plurality of element isolation insulating films formed between the charge storage layers respectively;
    a second insulating layer formed on the charge storage layers and the element isolation insulating films, the second insulating layer including a stacked structure of a first silicon nitride film, a first silicon oxide film, an intermediate insulating film having a relative dielectric constant of not less than 7 and a second silicon oxide film; and
    a control electrode formed on the second insulating layer,
    wherein the first silicon nitride film has a nitrogen concentration of not less than $21 \times 10^{15}$ atoms/cm$^2$;
    wherein the charge storage layers have respective lower side surfaces, and each element isolation insulating film includes a high-temperature oxide film formed along the lower side surfaces of the charge storage layers between the charge storage layers and a coating insulating film formed on an inside of the high-temperature oxide film; and
    wherein the high-temperature oxide film and the coating insulating film have respective upper surfaces, and the first silicon nitride film is formed on the upper surface of the high-temperature oxide film in upper surfaces of the element isolation insulating films and not on the upper surface of the coating insulating film.

2. The nonvolatile semiconductor memory device according to claim 1, wherein the first silicon nitride film is divided between the charge storage layers.

3. The nonvolatile semiconductor memory device according to claim 1, wherein the first silicon oxide film is formed directly on the element isolation insulating film.

4. The nonvolatile semiconductor memory device according to claim 1, wherein the second insulating layer includes a second silicon nitride film formed on the second silicon oxide film.

* * * * *